(12) United States Patent
Liu et al.

(10) Patent No.: US 8,050,376 B2
(45) Date of Patent: Nov. 1, 2011

(54) ALL DIGITAL PHASE-LOCKED LOOP WITH WIDELY LOCKED FREQUENCY

(75) Inventors: Shen-Iuan Liu, Taipei (TW); You-Jen Wang, Taipei (TW)

(73) Assignee: National Taiwan University, Taipei (TW)

( * ) Notice: Subject to any disclaimer, the term of this patent is extended or adjusted under 35 U.S.C. 154(b) by 695 days.

(21) Appl. No.: 12/170,742

(22) Filed: Jul. 10, 2008

(65) Prior Publication Data

US 2009/0147902 A1 Jun. 11, 2009

(30) Foreign Application Priority Data

Dec. 11, 2007 (TW) ................. 96147306 A

(51) Int. Cl.
*H03D 3/24* (2006.01)
(52) U.S. Cl. ......... 375/376; 375/375; 327/156; 327/159
(58) Field of Classification Search ............. 375/373, 375/375, 376; 327/156, 159
See application file for complete search history.

(56) References Cited

U.S. PATENT DOCUMENTS

| | | | |
|---|---|---|---|
| 6,348,823 B1 | 2/2002 | Pan | |
| 6,414,555 B2 | 7/2002 | Staszewski et al. | |
| 6,798,296 B2 | 9/2004 | Lin et al. | |
| 7,127,022 B1 * | 10/2006 | Dieguez | 375/375 |
| 7,177,611 B2 * | 2/2007 | Goldman | 455/260 |
| 7,556,656 B2 * | 7/2009 | Watanabe et al. | 29/623.5 |
| 7,715,515 B2 * | 5/2010 | Olsson et al. | 375/376 |
| 7,859,343 B2 * | 12/2010 | Huang et al. | 331/1 A |
| 2007/0205931 A1 | 9/2007 | Vanselow et al. | |

FOREIGN PATENT DOCUMENTS

| | | |
|---|---|---|
| TW | 451558 | 8/2001 |
| TW | I279085 | 4/2007 |

OTHER PUBLICATIONS

Wang, You-Jen et al. "All-Digital Delay-Locked Loop/Pulsewidth-Control Loop With Adjustable Duty Cycles" IEEE, Journal of Solid-State Circuits, vol. 41, No. 6, Jun. 2006 pp. 1262-1274.

(Continued)

*Primary Examiner* — Jean B Corrielus
(74) *Attorney, Agent, or Firm* — Volpe and Koenig, P.C.

(57) ABSTRACT

An all-digital phase-locked loop (ADPLL) composed of digital circuits is provided. The ADPLL includes a phase-frequency detector (PFD), a control unit, a digital controlled oscillator (DCO), and a plurality of frequency dividers. A first frequency divider divides a frequency of a feedback signal $CK_{OUT}$ by a natural number M to generate a first output signal $CK_{OUT}/M$. The PFD generates a decrement signal dn and an increment signal up, based on a phase difference and a frequency between a first reference clock signal $CK_{IN}$ and the first output signal $CK_{OUT}/M$. The DCO generates a clock signal $CK_{DCO}$ based on the digital control signals. A second frequency divider receives the digital control signals from the control unit and the $CK_{DCO}$ from the DCO and divides the frequency of the $CK_{DCO}$ by a bit number of the digital control signals to generate a feedback signal $CK_{OUT}$ to the first frequency divider.

15 Claims, 13 Drawing Sheets

OTHER PUBLICATIONS

Maneatis, John G. et al., "Self-Biased High-Bandwidth Low-Jitter 1-to-4096 Multiplier Clock Generator PLL", IEEE J. Solid-State Circuits, Nov. 2003, pp. 1795-1803, vol. 38, No. 11.

Lin, J. et al., "A PVT Tolerant 0.18MHz to 600MHz Self-Calibrated Digital PLL in 90nm CMOS Process", ISSCC Dig. Tec. Papers, Feb. 2004, pp. 488-489, Session 26 IEEE Internat'l Solid State Circuits Conference.

Watanabe, T. and S. Yamauchi, "An All-Digital PLL For Frequency Multiplication By 4 To 1022 With Seven-Cycle Lock Time", IEEE J. Solid-State Circuits, Feb. 2003, pp. 198-204, vol. 38, No. 2.

Chung, C. C. and C. Y. Lee, "An All-Digital Phase-Locked Loop For High-Speed Clock Generation", IEEE J. Solid-State Circuits, Feb. 2003, pp. 347-351, vol. 38, No. 2.

Chen, P. L., C. C. Chung, J. N. Yang and C. Y. Lee, "A Clock Generator With Cascaded Dynamic Frequency Counting Loops For Wide Multiplication Range Applications", IEEE J. Solid-State Circuits, Jun. 2006, pp. 1275-1285, vol. 41, No. 6.

Tierno, J. A., A. V. Rylyakov and D. J. Friedman, "A Wide Power Supply Range, Wide Tuning Range, All Static CMOS All Digital PLL in 65 nm SOI", IEEE J. Solid-State Circuits, Jan. 2003, pp. 42-51, vol. 43, No. 1.

\* cited by examiner

ALL DIGITAL PHASE-LOCKED LOOP WITH WIDELY LOCKED FREQUENCY

FIELD OF THE INVENTION

The present invention relates to a phase-locked loop, and more particularly to an all-digital phase-locked loop, for a wide range of frequencies on phase locking to electronic signals.

BACKGROUND OF THE INVENTION

Phase-locked loops (PLL) are widely used in telecommunications, computers and other electronic applications. With the development of the semiconductor industry, operation frequencies of microprocessors have been even higher than ever. A PLL is designed in a microprocessor as the system synchronizer as well as the frequency integrator, to eliminate any inconsistence in terms of timing between the external reference clock and internal clock, and to support the need of an internal high frequency clock. On the other hand, the PLL is much needed for system synchronizing, clock or data recovering, and frequency integration, in a communication system. PLL is important in a vast number of applications for system design.

Although being widely utilized, traditional phase-locked loops are digital PLLs containing the phase frequency detector(s), analog loop filter(s), and voltage controlled oscillator(s). Under the stream of the system on chip (SOC) design, issues regarding the integration of digital and analog circuits such as signal disturbing to the analog circuit will sure be encountered if the traditional PLL circuit design is adopted. Therefore, the all-digital phase-locked loop (ADPLL) has been prevailed in the market for application.

In general, basic circuit design of a typical ADPLL can be illustrated as FIG. 1 shows. As shown in FIG. 1, the ADPLL 1 is consisted of a phase frequency detector (PFD) 11, a digital loop filter 12, a digital controlled oscillator (DCO) 13, and a frequency divider 14. The PFD 11 compares a signal Fi from the DCO 13 with an outer reference signal Fr, and then outputs a series of either increment or decrement signals based upon the frequency as well as the phase difference between Fi and Fr. The loop filter 12 receives the signal series described above and converts the input into analog signals acceptable to the DCO 13, to adjust both the frequency and phase of the output from DCO 13. The DCO 13 is an oscillation circuit generating a relative oscillation frequency depending on the voltage of the analog signals, while the value of the frequency is within a certain range. On the feedback path of the circuit, the frequency divider 14 reduces its input signals by N (N is a natural number) times.

The operation process of the above ADPLL is summarized as follows. The PFD 11 compares a reference clock signal Fr with a feedback clock signal Fi from a frequency divider 14 (the frequency of the feedback signal has been reduced by N times) on either positive or negative edges. Decrement signals will be generated if the edges of Fi lead the edges of Fr. On the other hand, increment signal will be generated if the edges of Fi fall behind those of Fr. And then the digital loop filter 12 generates a control signal to the DCO 13, based on the input from the PFD 11. According to the control signal, a feedback signal is generated from the DCO 13 and passes through the frequency divider 14 which reduces the frequency by N times. The frequency-divided feedback signal Fi will then be compared with Fr as a routine, to continuously modify the voltage level of the control signal from the DCO 13 until the frequency and phase difference between Fr and Fi is minimized. When the locking is effective, either the decrement or the increment signals from PFD 11 shall be zero.

Traditional analog PLLs require accurate analog and passive devices such as resistors and capacitors, and they are sensitive to the process, voltage, and temperature (PVT) variations. Compared with analog PLLs, the all-digital PLL (ADPLL) has advantages such as robustness, easy-to-process migration, and without a passive loop filter. But the oscillator in the analog PLL has a higher operation frequency and better jitter performance than those of the digital controlled oscillator (DCO) in the ADPLL. Moreover, ADPLL has the problems of finite frequency resolution and quantization noise. To have a wider range of operation frequency, the algorithm in an ADPLL has to shorten the locked time. To have a large multiplication factor, the frequency resolution must be high enough to reduce the frequency error and jitter issue. Unfortunately, due to a limited bandwidth (490 MHz to 1.39 GHz), outputs of the current digital controlled oscillators still cannot be broadly applied to the current wireless communication facilities (15 KHz to 1.39 GHz). Therefore, the need for a new ADPLL with an increased DCO operation frequency range and enhanced frequency resolution is urgent.

SUMMARY OF THE INVENTION

In accordance with one aspect of the present invention, an all-digital phase-locked loop (ADPLL) composed of digital circuits is provided. Advantages of the new design include shorter locking time and less process dependency. The design can be efficiently transferred to different process platforms, to reduce the time consuming for system redevelopment.

In accordance with another aspect of the present invention, an all-digital phase-locked loop is provided, which is designed for the effect of a wide range of phase locking by means of adding an N-time frequency divider in front of the signal input of the ADPLL to set a frequency dividing ratio of M/N against an M-time frequency divider inside the ADPLL. As a result, the ADPLL has the advantages of higher search speed, shorter locking time, less phase jitter, and being functional on extremely high frequencies.

In accordance with a further aspect of the present invention, an ADPLL circuit architecture containing a plural number of frequency dividers is provided. Each of the frequency dividers comprises a NOR gate, three MOS components, and three tri-state inverters. Compared with the conventional static divider, the newly designed divide-by-two circuit has fewer MOS counts, less power consumption, and higher operation frequencies. Furthermore, it can be latched to either high or low arbitrarily to avoid current leakage. Therefore, the dividers are suitable for wide frequency range as well as programmable applications.

In accordance with further another aspect of the present invention, a digital controlled oscillator (DCO) comprising a plurality of tri-state inverters, a plurality of NAND gates, and a plurality of MOS components is provided, wherein eight of the MOS components are connected to four inverters. The difference in physical dimensions or size of the MOS components results in different capacitance of each component. The signal resolution in terms of the frequency of the DCO is improved by taking advantage of capacitance variations between the MOS components.

In accordance with further another aspect of the present invention, a method to operate an ADPLL composed of at least a first frequency divider, a control unit, a PFD, a DCO, a second frequency divider and a third frequency divider is provided. There are four main processes, namely the counting process, the rough tuning process, the fine tuning process, and the locked mode process. The first frequency divider divides a frequency of a feedback signal by a natural number M to generate a first output signal. The PFD generates a decrement signal and an increment signal based upon a phase difference and a frequency difference between a first reference clock signal ($CK_{IN}$) and the first output signal. The control unit receives the decrement signal, the increment signal, the natural number M and a second reference clock signal ($CK_{IN}/N$) to generate a plurality of digital control signals, and the digital control signals from the control unit comprise a first control signal, a second control signal, a third control signal, a first natural number N1 and a second natural number N2, and the N1 and N2 act as the divisors for the first and the second frequency dividers, respectively. The DCO generates a frequency of a clock signal ($CK_{DCO}$) based upon the digital control signals. The second frequency divider receives the digital control signals from the control unit and the frequency of the clock signal ($CK_{DCO}$), and divides the frequency of the clock signal by a bit number of the digital control signals to generate a feedback signal ($CK_{OUT}$) to the first frequency divider. The third frequency divider divides the frequency of the first reference clock signal ($CK_{IN}$) by a natural number N. In each process, the ADPLL repeatedly operates its basic functions to iterate errors until a phase difference is under an acceptable level, given that the values of the natural numbers have been pre-defined. The status of phase-locked can be achieved effectively after completion of the four processes sequentially.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed. It is also to be noted that the present invention provides several feasible concepts that could be embodied in a variety of physical backgrounds.

First Embodiment

Figure 1:
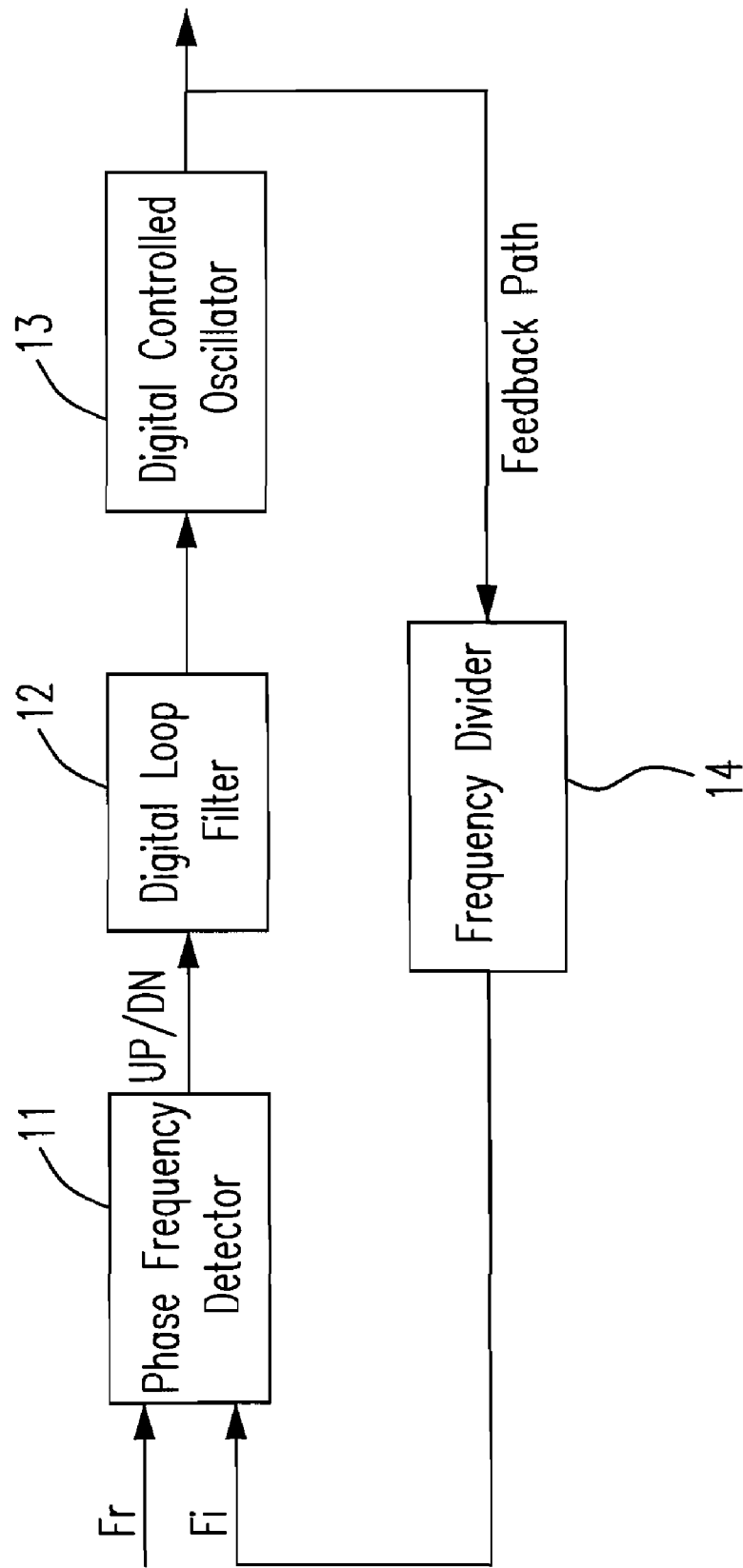
FIG. 1 is a schematic diagram showing an all-digital phase-locked loop (ADPLL) in the prior art.
Figure 2:
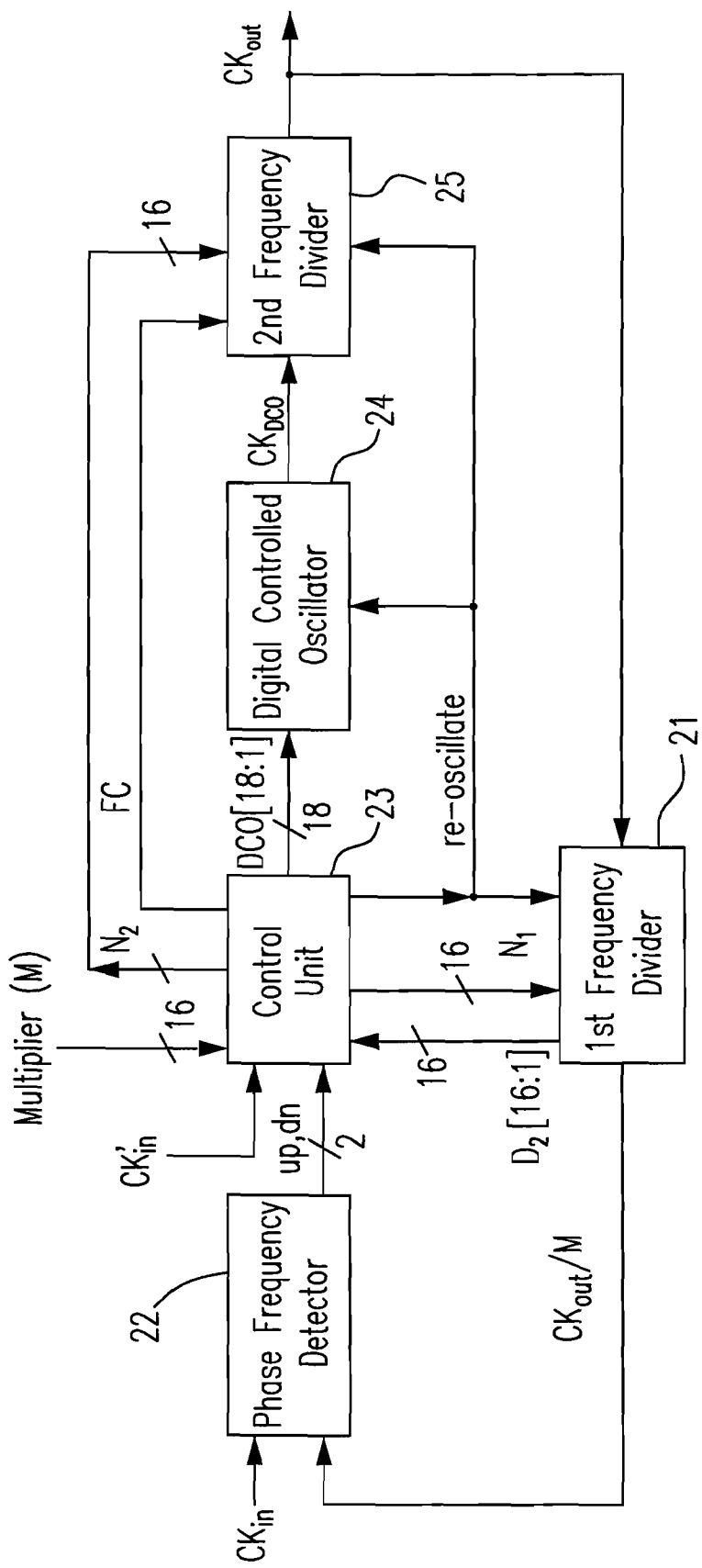
FIG. 2 is a schematic diagram showing an ADPLL according to a preferred embodiment of the present invention.

A first embodiment of the present invention is described in FIG. 2. FIG. 2 shows a circuit layout of an all-digital phase-locked loop (ADPLL) 2, wherein the ADPLL 2 is integrated into a local oscillator of an FM broadcast receiver.

According to FIG. 2, the ADPLL 2 comprises a first frequency divider 21, a phase frequency detector (PFD) 22, a control unit 23, a digital-controlled oscillator (DCO) 24, and a second frequency divider 25. The first frequency divider divides a frequency of a feedback signal $CK_{OUT}$ by a natural number M to reduce the frequency by M times, so as to generate a first output signal $CK_{OUT}/M$. The PFD 22 generates a decrement signal dn and an increment signal up, based on a phase difference and a frequency difference between a first reference clock signal $CK_{IN}$ and the first output signal $CK_{OUT}/M$. The control unit 23, coupled to the PFD 22, respectively receives the dn, the up, the M, and a second reference clock signal $CK'_{IN}$ to generate a plurality of digital control signals, wherein the frequencies of the first and the second reference clock signals, or $CK_{IN}$ and $CK'_{IN}$, are identical. The DCO 24, coupled to the control unit 23, generates a clock signal $CK_{DCO}$ based on the digital control signals. The second frequency divider 25, coupled to the DCO 24, receives the digital control signals from the control unit 23 and the $CK_{DCO}$ from the DCO 24 and divides the frequency of the $CK_{DCO}$ by a bit number of the digital control signals to generate a feedback signal $CK_{OUT}$ to the first frequency divider 21.

When the ADPLL 2 is integrated into a local oscillator of an FM broadcast receiver, the feedback signal $CK_{OUT}$ from the second frequency divider 25 can be input to the local oscillator for controlling the oscillation frequency.

Besides, the digital control signals from the control unit 23 comprise at least a first control signal (first cycle, FC), a second control signal re-oscillate, a third control signal DCO [18:1], a first natural number N1, and a second natural number N2. The N1 and the N2 serve as the divisors of the first frequency divider 21 and the second frequency divider 25, respectively.

Second Embodiment

Figure 3:
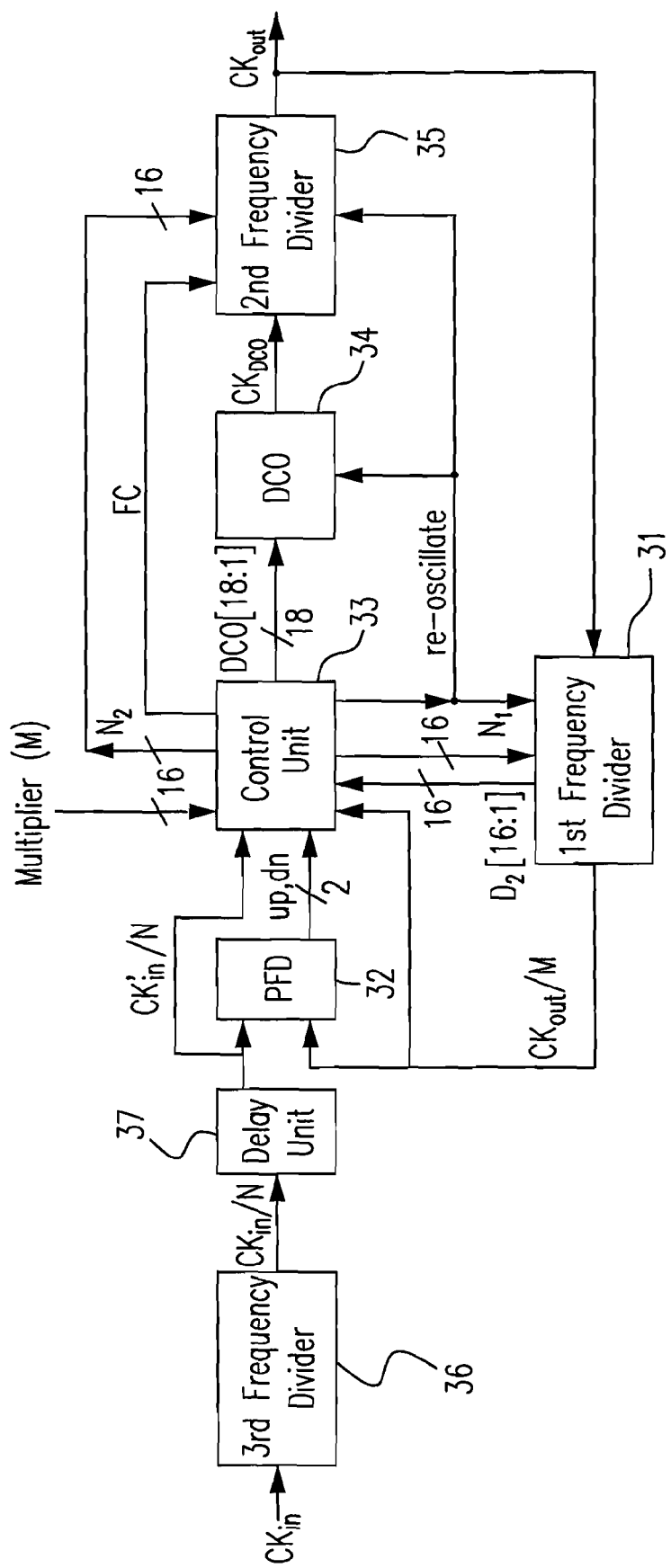
FIG. 3 is a schematic diagram showing an ADPLL according to another preferred embodiment of the present invention.

An advantageous embodiment for the present invention is described in FIG. 3. Based upon the first embodiment, one additional frequency divider is provided at the input terminal of the ADPLL to result in an input versus output frequency ratio of M/N where M and N are natural numbers. Please see the descriptions below.

FIG. 3 shows a circuit of the second embodiment of the present design for an ADPLL 3. In addition to a first frequency divider 31, a PFD 32, a control unit 33, a DCO 34, and a second frequency divider 35, the ADPLL 3 further comprises a third frequency divider 36 and a delay unit 37. The third frequency divider 36 is designed for producing a second output signal $CK_{IN}/N$ by dividing an input clock signal $CK_{IN}$ by a natural number N. The delay unit 37, coupled to the third frequency divider 36, delays the second output signal $CK_{IN}/N$ for a period of time based upon a timing difference of a level change of the second control signal re-oscillate. The delayed second output signal serves as a reference clock signal for the PFD 32. More details of a physical embodiment of the ADPLL 3 in FIG. 3 are described below.

Firstly, a first reference clock signal $CK_{IN}$ (10 MHz) is inputted into the third frequency divider 36 (a divisor N is 1) for frequency dividing, so as to generate a second output signal $CK_{IN}/N$ (10 MHz). In the mean time, a feedback signal $CK_{OUT}$ (13.9 MHz) is input into the first frequency divider 31 (a divisor M is 32768), to generate a first output signal $CK_{OUT}/M$. And the default value of DCO 32 output $CK_{DCO}$ is set to 1.39 GHz.

For the reason that the DCO 34, the first frequency divider 31, and the second frequency divider 35 all are circuits with the effect of signal delay which may end up with frequency errors as well as phase errors of a decrement signal dn and a increment signal up from the PFD 32, the delay unit 37 of the second embodiment of the present invention provides time delay to complement those due to the DCO 34, the first frequency divider 31, and the second frequency divider 35. The delay unit 37 delays the second output signal $CK_{IN}/N$ from the third frequency divider 36 for a period of time, based upon the timing difference of a level change of the second control signal re-oscillate. The delayed second output signal serves as the second reference clock signal for the PFD 32. In this embodiment, a digitally controlled delay line is utilized for the delay unit 37, to delay the second output signal $CK_{IN}/N$ from the third frequency divider 36 for 600 picosecond and input the delayed signal to the PFD 32.

Figure 4:
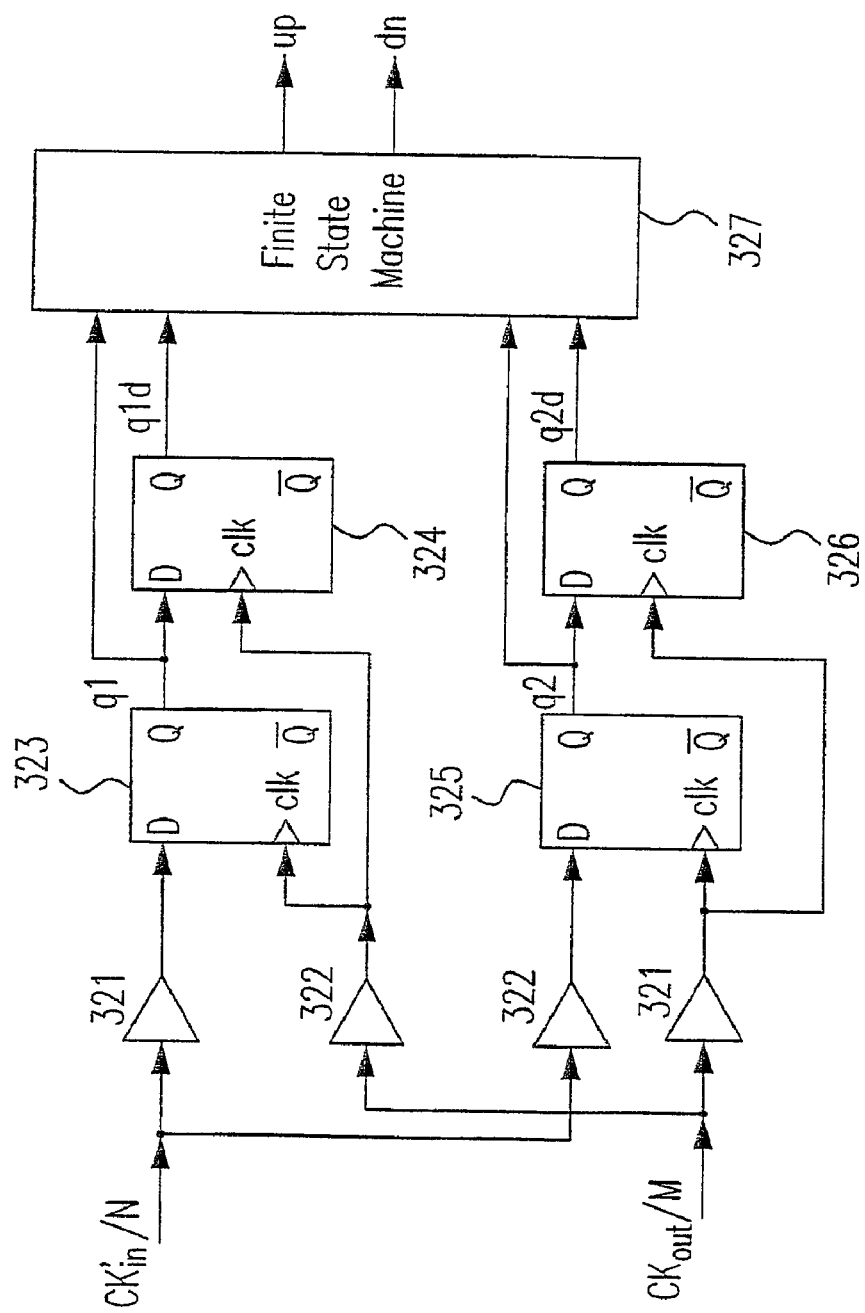
FIG. 4 is a schematic diagram showing the circuit design of a phase frequency detector (PFD) according to a preferred embodiment of the present invention.

The PFD 32, comprising four buffers, four D type flip-flops (DFFs), and a finite state machine (FSM), receives the delayed second output signal $CK_{IN}/N$ and the first output signal $CK_{OUT}/M$. FIG. 4 shows an embodiment of the PFD for the present invention.

Inside the PFD 32, a set of a first buffer 321 and a second buffer 322 delay the input signals by Td1 and Td2 respectively. As a result, an additional timing difference ΔT, nearly 5 picosecond, occurs to the input signals before entering the DFFs. A first DFF 323 samples the $CK'_{IN}/N$ delayed by Td1, according to a positive edge of each cycle of the first output signal delayed by Td2, and outputs a first sampling result q1 to a second DFF 324 for delaying a full cycle to produce a second sampling result q1d. And a third DFF 325 samples from the $CK'_{IN}/N$ delayed by Td2, according to a positive edge of each cycle of the first output signal delayed by Td1, and outputs a third sampling result q2 to a fourth DFF 326 for delaying a full cycle to produce a fourth sampling result q2d.

The first sampling result q1 is 1 if the phase of the first output signal $CK_{OUT}/M$ leads that of the delayed second output signal by 20 picosecond or even more. Otherwise, the q1 is 0. When q1 is 1, after a cycle the q1d will be 1, and vice versa.

The third sampling result q2 is 0 if the phase of the first output signal $CK_{OUT}/M$ lags that of the delayed second output signal by 20 picosecond or even more. Otherwise, the q2 is 0. When q2 is 1, after a cycle the q2d will be 1, and vice versa.

The finite state machine (FSM) 327 generates the decrement signal dn and the increment signal up based upon each of the output results (q1, q1d, q2, q2d) from the four DFFs. The FSM 327 generates the decrement signal dn if both the q1 and the q2 are 0, or if the q1 changes from 1 to 0. The FSM 327 generates the increment signal up if both the q1 and the q2 are 1, or if the q2 changes from 0 to 1. Table 1 is the truth table showing the relationship among the sampling results (q1, q1d, q2, q2d) and control signals (the dn and the up). For instance, the up is 0 and the dn is 1 if all the sampling results are 0.

TABLE 1

Truth Table of the Sampling Results versus Control Signals

| | q1, q2 | | | |
|---|---|---|---|---|
| q1d, q2d | 0, 0 | 0, 1 | 1, 1 | 1, 0 |
| 0, 0 | 0/1(up/dn) | 1/0(up/dn) | 1/0(up/dn) | x/x(up/dn) |
| 0, 1 | 0/1(up/dn) | 0/0(up/dn) | 1/0(up/dn) | x/x(up/dn) |
| 1, 1 | 0/1(up/dn) | 0/1(up/dn) | 1/0(up/dn) | x/x(up/dn) |
| 1, 0 | x/x(up/dn) | x/x(up/dn) | x/x(up/dn) | x/x(up/dn) |

Figure 5:
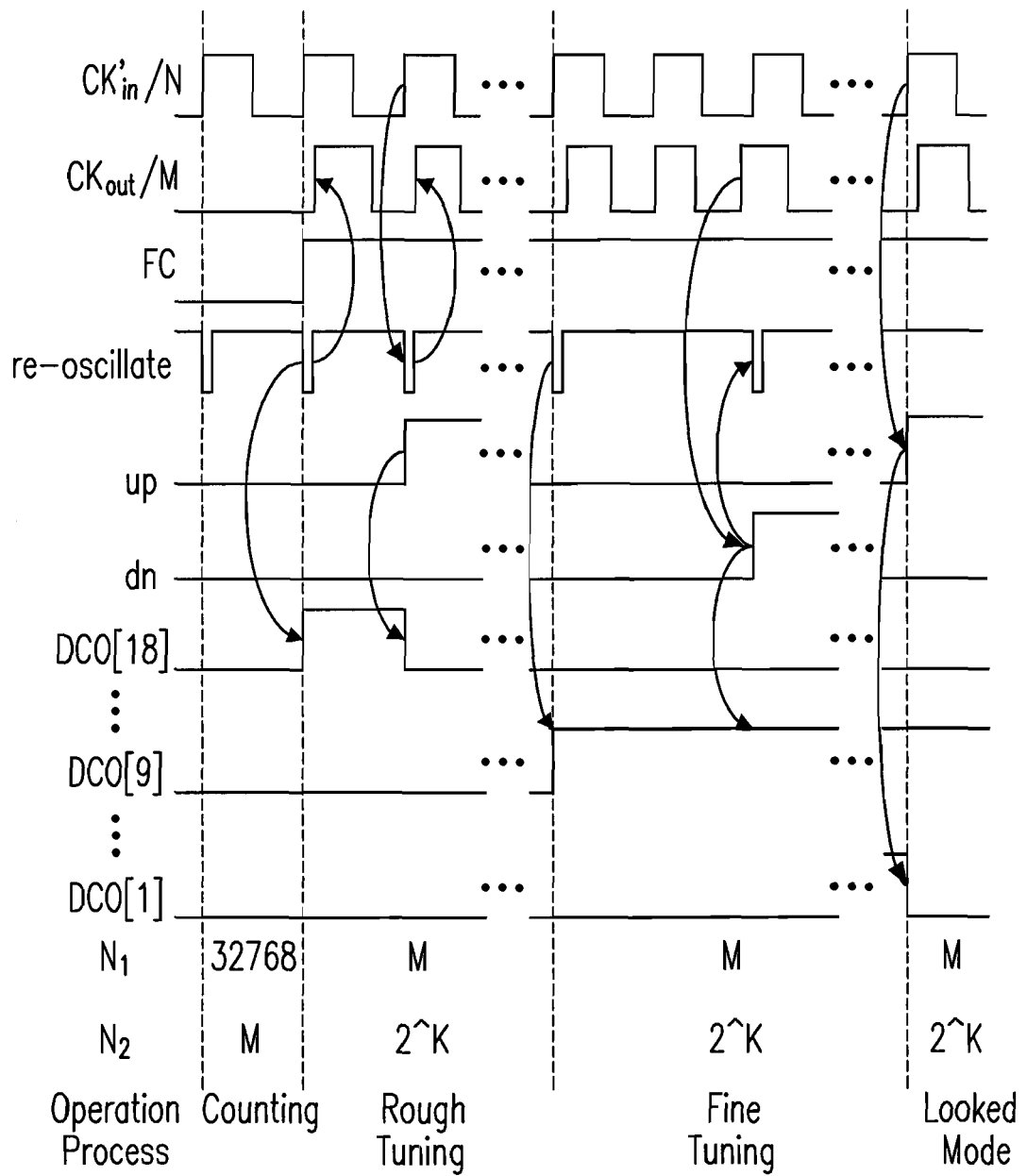
FIG. 5 is a schematic diagram showing the relevant signals and selected divisors along the four processes of the operation method for the ADPLL.

The control unit 33 comprises a 5-bit counter, a register, and a plurality of logic circuits. The control unit 33 receives a second reference clock signal $CK'_{IN}/N$ (10 MHz) from the third frequency divider 36 (a divisor N). Operational processes of the control unit 33 comprise a counter, a rough tuning, a fine tuning, and a locked mode, based upon a positive edge in each cycle of the second reference clock signal $CK'_{IN}/N$. FIG. 5 provides a schematic representation of the four operational processes.

According to FIG. 5, the control unit 33 generates a plurality of digital signals comprising a first control signal (first cycle, FC), a second control signal (re-oscillate), a third control signal DCO[18:1], a first natural number N1, and a second natural number N2, during the operational processes. The N1 and the N2 serve as the divisors of the first frequency divider 31 and the second frequency divider 35, respectively. Operation modes and functions of the digital control signals are described below.

Referring to FIG. 5, in the counter process, the re-oscillate is triggered by a positive edge of a first period waveform of the $CK'_{IN}/N$. The N1 is set to 32768 and the N2 is set to M (M is within a range from 1 to 32768, say 100 for example). The third control signal DCO[18:1] is set to 0. The output value of the second frequency divider 35 is: (an oscillation frequency defaulted by the DCO 34/M)/(a reference clock signal from the third frequency divider 36/N). And the integral part of $\log_2$ $(CK_{DCO}/M)/(CK_{IN}/N)$ is chosen as a variable K (K in a range from 0 to 15). In this embodiment, the calculation is: (1.39 GHz/100)/(10 MHz/1)=1.39, and $\log_2$ 1.39=0, so K=0.

The purpose of the counter process is to calculate for a divisor of the first frequency divider 31, to make the frequency of an output signal near M/N times of that of an input signal. Meanwhile, a maximum error of 100% is expected. So the process of rough tuning is necessary. Besides, the N2 is set to $2^K$ when the counting is over, to allow a frequency of a feedback signal from the second frequency divider 35 to be within a range between $CK_{IN} \times M/N$ and $2 \times CK_{IN} \times M/N$. In this embodiment, the N2 is 1. So the frequency of the feedback signal is within the range between 10 MHz×(100/1) and 2×10 MHz×(100/1).

During the second to the tenth period of the $CK'_{IN}/N$, which is in the rough tune process, the first control signal FC is triggered based on a positive edge of a second cycle waveform of the $CK'_{IN}/N$. The third control signal DCO[18:1] is triggered by a respective positive edge of all periods of the $CK'_{IN}/N$ except the first period after the first period is over. The value of the N1 is set equal to M and the value of the N2 equal to $2^K$. Consequently, a frequency of the feedback signal $CK_{OUT}$ from the second frequency divider 35 is $CK_{IN} \times$ (M/N) which provides a clock with a higher frequency for applications in other systems. In this embodiment, the N1 is set to 100 and the N2 is set to 1. Therefore the frequency of $CK_{OUT}$ is 10 MHz×(100/1)=1 GHz, for the need of a high frequency output clock utilized in a clock and data recovery (CDR) system.

The control unit 33 modifies a bit number of the third control signal DCO[18:1] based on the decrement signal dn and the increment signal up, to adjust a frequency of the $CK_{DCO}$ outputted by the DCO 34. If the bit number of the DCO [18:1] is decreased, the frequency of the $CK_{DCO}$ increases, and vice versa. In addition, the DCO[18:1] comprises a first group, a second group, and a third group of binary codes for controlling the DCO 34. In this embodiment, the DCO[18:1] is 18 bits (from a DCO[1], a DCO[2], all the way to a DCO[18]), and all the bits are set to 0 in the counting process.

In the rough tuning process, the N1 is set equal to M, and the N2 is set equal to 2^K, to allow a frequency of the feedback signal $CK_{OUT}$ from the second frequency divider 35 to approach $CK_{IN} \times$(M/N). In this embodiment, the N1 is set to 100 and the N2 is 1. Consequently, a frequency of the $CK_{OUT}$ is: 10 MHz×(100/1)=1 GHz. The DCO[18] is set to 1 during a second period of the $CK'_{IN}/N$ (a divisor N=1). During a third period of the $CK'_{IN}/N$ (a divisor N=1), let the DCO[18] be 0 for escalating the oscillation frequency of the DCO 34 if the increment signal up is 1; let the DCO[18] be 1 for reducing the oscillation frequency of the DCO 34 if the decrement signal dn is 1. When the value of the DCO[18] has been determined, a DCO[17] is set to 1. Then during a fourth period of the $CK'_{IN}/N$ (a divisor N=1), a value of the DCO[17] is determined based on the increment signal up and the decrement signal dn, and a DCO[16] is set to 1. Likewise, values of a DCO[15], a DCO[14], a DCO[13], a DCO[12], a DCO[11], a DCO[10] are determined during a fifth, a sixth, a seventh, an eighth, a ninth, and a tenth periods of the $CK'_{IN}/N$ (a divisor N=1), respectively.

The above rough tuning process is for rapidly reducing the frequency difference between the $CK_{OUT}$ and the $CK_{IN} \times$(M/N), to allow a frequency of the $CK_{OUT}$ to be much closer to M/N times of that of the $CK_{IN}$. In this embodiment, a series of the control signals from DCO[18] to DCO[10] have been adjusted.

Again, referring to FIG. 5, the fine tuning process starts from an eleventh period of the $CK'_{IN}/N$ till a frequency ratio between the $CK_{OUT}$ and the $CK'_{IN}/N$ has achieved M/N. During the eleventh period of the $CK'_{IN}/N$, a DCO[9] is defaulted to 1. The DCO[9] is set to 0 for escalating the oscillation frequency of the DCO 34 if the increment signal up is 1; The DCO[9] is set to 1 for reducing the oscillation frequency of the DCO 34 if the decrement signal dn is 1. When the value of the DCO[9] has been determined, a DCO[8] is set to 1. Then a value of the DCO[8] is determined based on the increment signal up and the decrement signal dn, and a DCO[7] is set to 1. Likewise, values of a DCO[6], a DCO[5], a DCO[4], a DCO[3], a DCO[2], and a DCO[1] are determined per the same procedure.

The above fine tuning process is for reducing the frequency difference between the $CK_{OUT}$ and the $CK_{IN} \times$(M/N), for letting a frequency of the $CK_{OUT}$ approach to M/N times of that of the $CK_{IN}$. In this embodiment, a series of the control signals from a DCO[9] to a DCO[1] have been adjusted.

Finally, the locked mode process starts at the time when a value of the DCO[1] has been determined. The N1 is set to M and the N2 is 2^K (the K is an integer in a range from 0 to 15), for letting a frequency of the feedback signal $CK_{OUT}$ from the second frequency divider 35 be M/N times of that of the $CK_{IN}$. In this embodiment, the N1 is 100, and the N2 is 1. Therefore, the frequency of the feedback signal from the second frequency divider 35 equals to: 10 MHz×(100/1)=1 GHz.

The locked mode process is for stabilizing the output frequency of the ADPLL, and for keeping the consistency in teams of the phase as well as the frequency between the first output signal $CK_{OUT}/M$ and the second reference clock signal $CK'_{IN}/N$.

Figure 6:
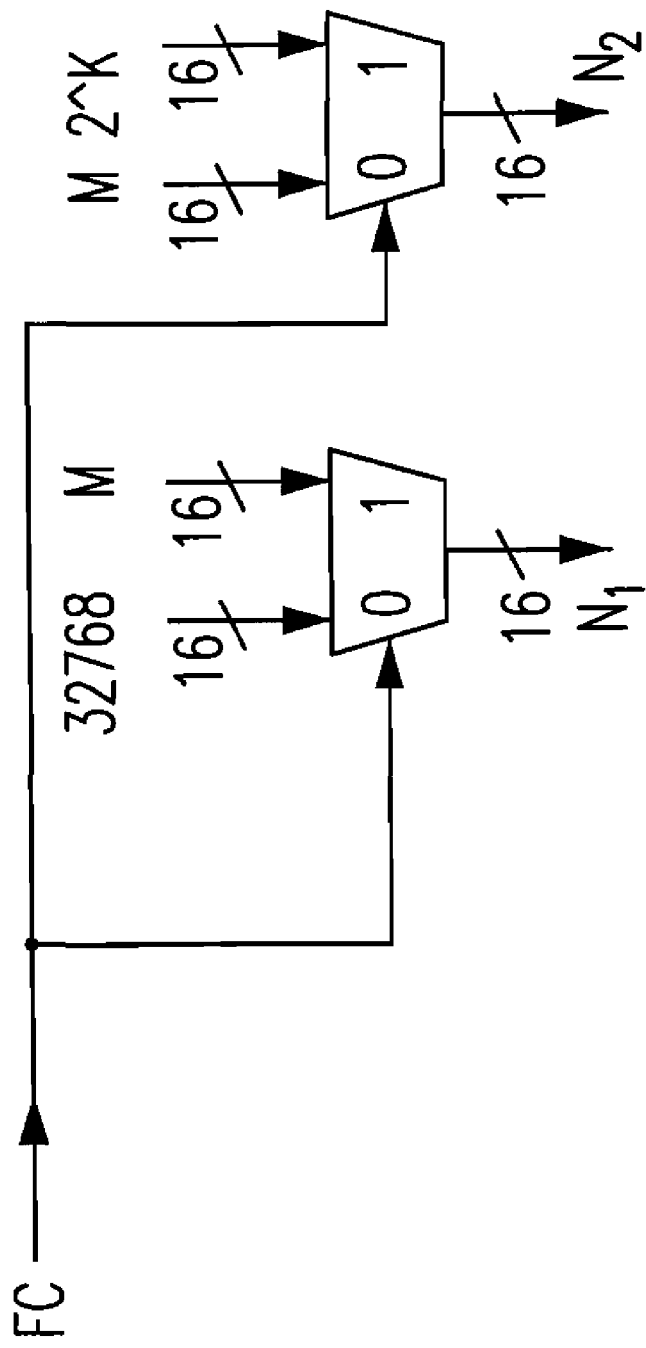
FIG. 6 is a schematic diagram showing the circuit structure of a first multiplexer according to a preferred embodiment of the present invention.

Values of the divisor for the first frequency divider 31 N1 and the divisor for the second frequency divider 35 N2 vary alone with the process changes. In order to provide more adequate divisors to the frequency dividers for more efficiently keeping the frequency of the feedback signal $CK_{OUT}$ approaching to MIN times of that of the $CK_{IN}$, a first multiplexer 38 is provided in the control unit 33. FIG. 6 illustrates an embodiment of the first multiplexer. The multiplexer receives a first value group of the natural number M and a value of 32768, and a second value group of the natural number M and a value of 2^K (the K is an integer within a value between 0 to 15) for respectively determining the N1 and the N2, based upon a signal level of the first control signal FC. In this embodiment, the first multiplexer selects the value of M for the N1 and the 2^K (K=0) for the N2 respectively, according to a low signal level (0) of the FC. Those varieties of the value of M and the 2^K are manually controlled (the M is within a range from 1 to 32768) and calculated by the control unit 33 in the counting process, respectively.

Figure 7:
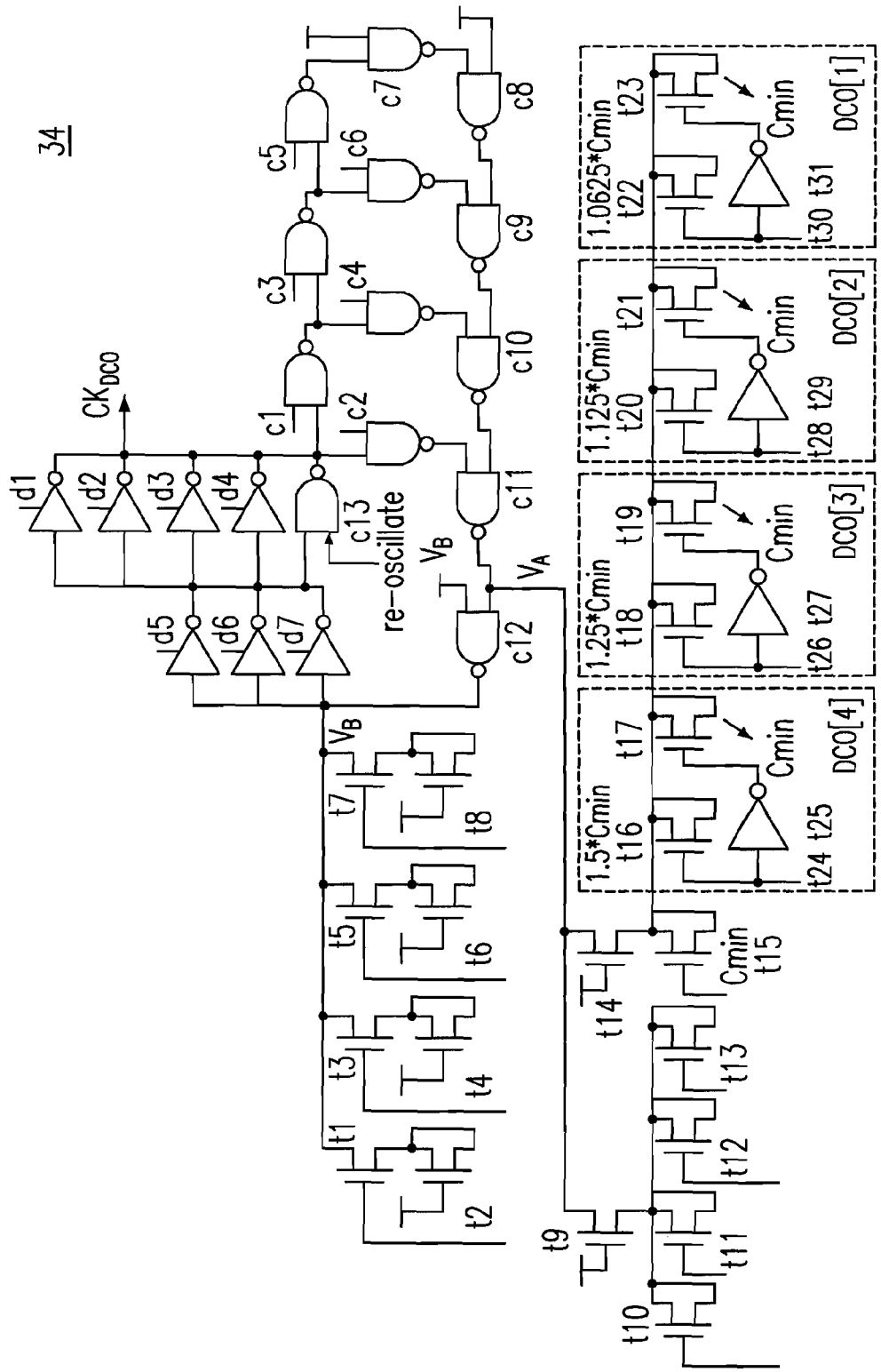
FIG. 7 is a schematic diagram showing the circuit structure of a digital controlled oscillator (DCO) according to a preferred embodiment of the present invention.

FIG. 7 shows an embodiment of the DCO 34 for the present invention. The DCO 34 generating a frequency of the $CK_{DCO}$ comprises a circuit structure. The circuit structure comprises a plurality of tri-state inverters, a plurality of NAND gates, and a plurality of MOS transistors connected to the inverters and the NAND gates. In this embodiment, there are 7 tri-state inverters d1~d7, 13 NAND gates c1~c13, and 31 MOS components t1~t31.

Figure 8:
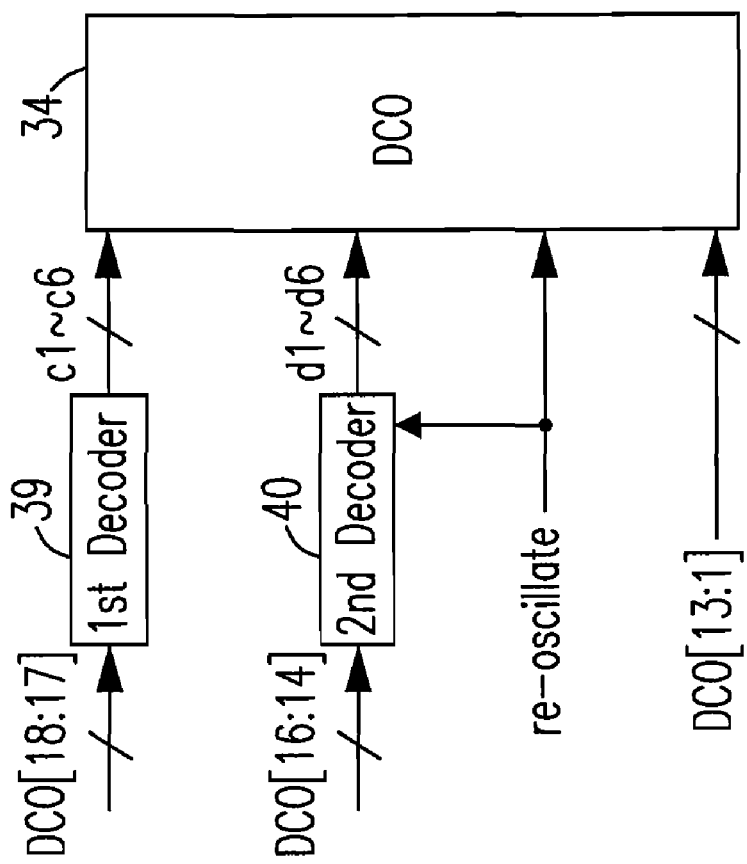
FIG. 8 is a schematic diagram showing the circuit structure of a first decoder, a second decoder and the DCO according to a preferred embodiment of the present invention.

In another advantageous embodiment, referring to FIG. 8, the present invention further provides a first decoder 39 and a second decoder 40, to enable a first group of binary codes (DCO[18]~DCO[17]) and a second group of binary codes (DCO[16]~DCO[14]) to produce a variety of on-off combinations of the NAND gates c1~c13 and the tri-state inverters d1~d7. According to FIG. 8, the first decoder 39 is for translating the first group of binary codes from 2 bits to 6 bits, to control the on-off statuses of the NAND gates c1~c6; The second decoder 40 is for translating the second group of binary codes from 3 bits to 7 bits, to control the on-off statuses of the tri-state inverters d1~d7; And the third group of binary codes (DCO[13]~DCO[1]) are directly inputted to the DCO 34, to control the on-off statuses of 17 out of the 31 MOS components.

In another advantageous embodiment of the present invention, the DCO 34 is a ring oscillator composed of an odd number of invertible logic gates in a circle loop. A digital signal is inverted after traveling a full cycle of the loop. An effect of oscillation is resulted by repeated inversion.

In another advantageous embodiment of the present invention, there exist 2^2 types (for there are 2 bits in the first group of binary codes) of decoding conditions stored in the NAND gates, 2^3 types (for there are 3 bits in the second group of binary codes) of decoding conditions stored in the tri-state inverters, and 2^13 types (for there are 13 bits in the third group of binary codes) of switch conditions for the MOS transistors. Therefore, the DCO 34 has oscillation frequencies of 2^18 variations. Frequency resolution of the DCO 34 is improved based on the variations. An oscillation level of the DCO 34 is 5 (an NAND gate c1 is set to 0, an NAND gate c2 is 1, and a c4 is 1), if a decoded bit stored in the NAND gates is 00. An oscillation level of the DCO 34 is 7 (a c1 is 1, a c2 is 0, a c3 is 0, a c4 is 1, and a c6 is 1), if a decoded bit stored in the NAND gates is 01. An oscillation level of the DCO is 9 (a c1 is 1, a c2 is 0, a c3 is 1, a c4 is 0, a c5 is 0, and a c6 is 1), if a decoded bit stored in the NAND gates is 10. And an oscillation level of the DCO is 11 (a c1 is 1, a c2 is 0, a c3 is 1, a c4 is 0, a c5 is 1, and a c6 is 0), if a decoded bit stored in the NAND gates is 11.

In this embodiment, a decoded bit stored in the NAND gates (c1~c13) is 00. Consequently, an oscillation level of the DCO 34 is 5, counting from a tri-state inverter d7, an NAND gate c13, an NAND gate c2, an NAND gate c11, and an NAND gate c12.

In another advantageous embodiment of the invention, referring to FIG. 7, eight MOS transistors t16~t23 receiving binary codes DCO[4]~DCO[1] are connected to four inverters, for utilizing inversion signals of the binary codes to respectively control a gate voltage between each two MOS transistors. A frequency of the clock signal $CK_{DCO}$ from the DCO 34 is adjusted by a parasitic capacitance resulting in a size difference between two MOS transistors.

Figure 9:
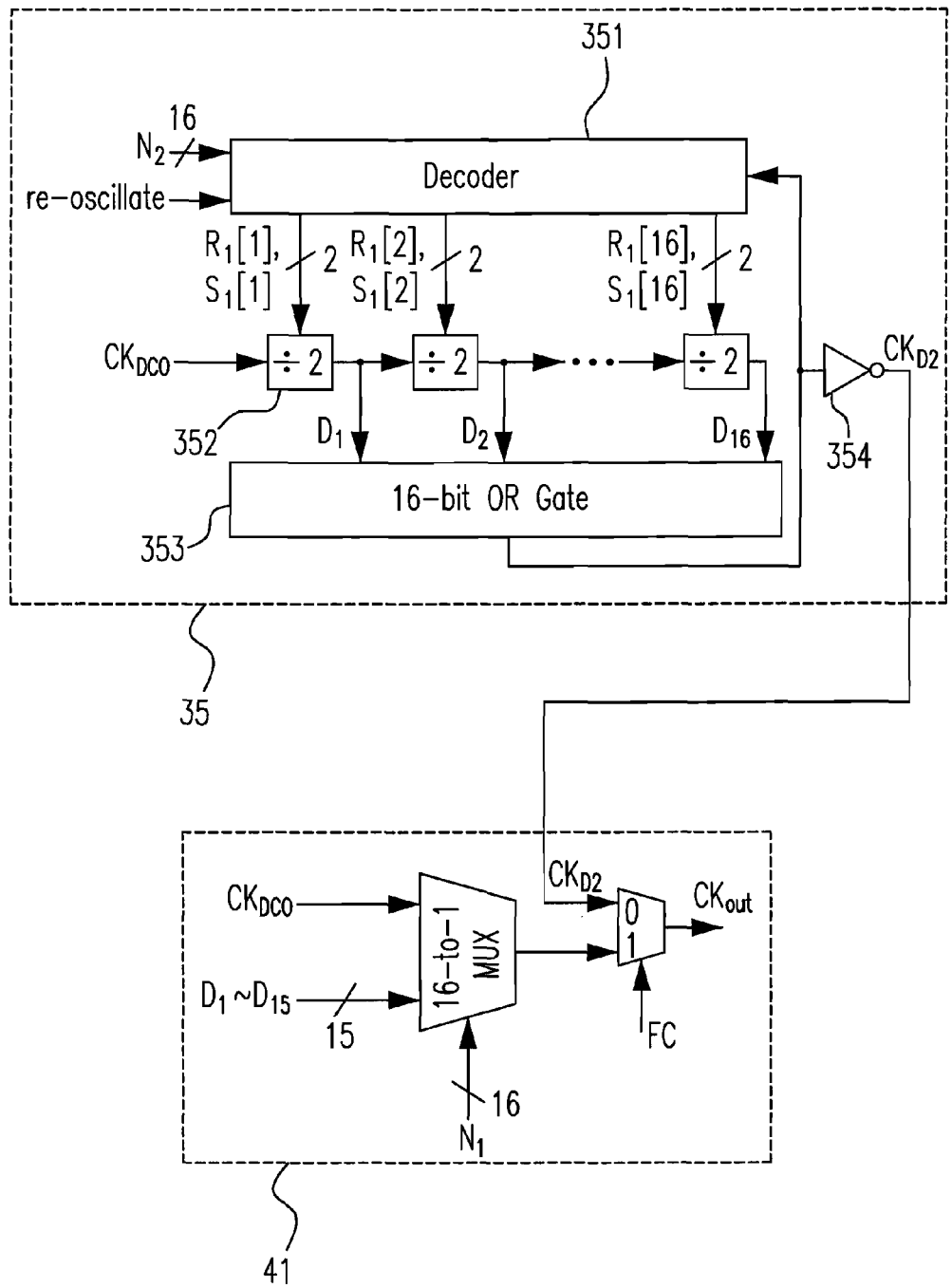
FIG. 9 is a schematic diagram showing the circuit structure of a second frequency divider and a second multiplexer according to a preferred embodiment of the present invention.

FIG. 9 shows another advantageous embodiment of the present invention. To improve the duty cycle of 1 GHz of the clock signal $CK_{OUT}$, a second multiplexer is provided in the ADPLL. According to FIG. 9, the second multiplexer 41 coupled to the second frequency divider 35 receives the $CK_{OUT}$ from the DCO 34, an output signal $CK_{D2}$ from the second frequency divider 35, a plurality of frequency-divided signals (D1~D15) from the second frequency divider 35, the N2 and the first control signal FC. A decoder 351 in the second frequency divider 35 receives the N2 and the second control signal re-oscillate to generate two groups of 16-bit signals, namely R and S. The Rs and the Ss pass through a plurality of divide-by-two circuits respectively for frequency reduction, to produce a plurality of frequency-divided signals D1~D16. The D1~D16 signals pass through a 16-bit OR gate 353 and an inverter 354, to produce the output signal $CK_{D2}$.

The second multiplexer 41 selects its output signal $CK_{OUT}$ from a group comprising the $CK_{DCO}$, the $CK_{D2}$, and the frequency-divided signals D1~D15, according to the N1 and the FC. In addition, the second multiplexer 41 selects its output signal from a group comprising the $CK_{DCO}$ and the D1~D15 based on the N1, if a signal level of the FC is high (1). In this embodiment, the $CK_{DCO}$ is selected as an output signal $CK_{OUT}$ if K is 0. And if K is 1, the frequency-divided signal D1 is outputted. Table 2 shows the relationship among those signals and values.

TABLE 2

| K | $N2 = 2^K$ | $CK_{OUT}$ |
|---|---|---|
| 0 | 1 | $CK_{DCO}$ |
| 1 | 2 | D1 |
| 2 | 4 | D2 |
| ... | ... | ... |
| 15 | $2^{15}$ | D15 |

On the contrary, the output signal from the second frequency divider 35 is selected as an output signal of the second multiplexer 41 if a signal level of the FC is low (0). In this case, K is 0. So the frequency of $CK_{DCO}$ is 1 GHz.

Simulation Result

A signal-chip integrated circuit has been built per the present invention. A reference clock signal from a signal generator was inputted into the IC while an output signal from the second frequency divider of the ADPLL was observed by an oscilloscope.

Figure 10A:
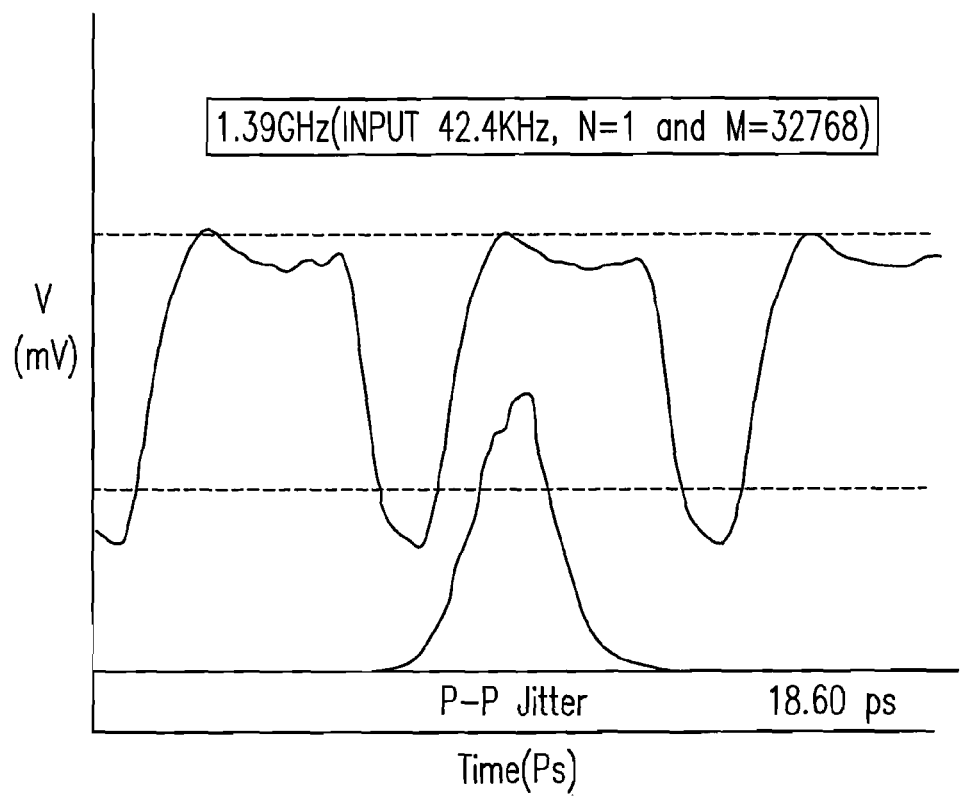
FIG. 10(a) and FIG. 10(b) show the waveforms of the outputs of a second frequency divider.

FIG. 10(a) shows the waveform of an output signal from the second frequency divider, when a frequency of the second reference clock signal is 42.4 KHz, N=1, and M=32768. It was observed that the frequency of the output signal was 1.39 GHz and a value of peak-to-peak jitter was 18.6 picosecond, less than 2.6% of an output period.

Figure 10B:
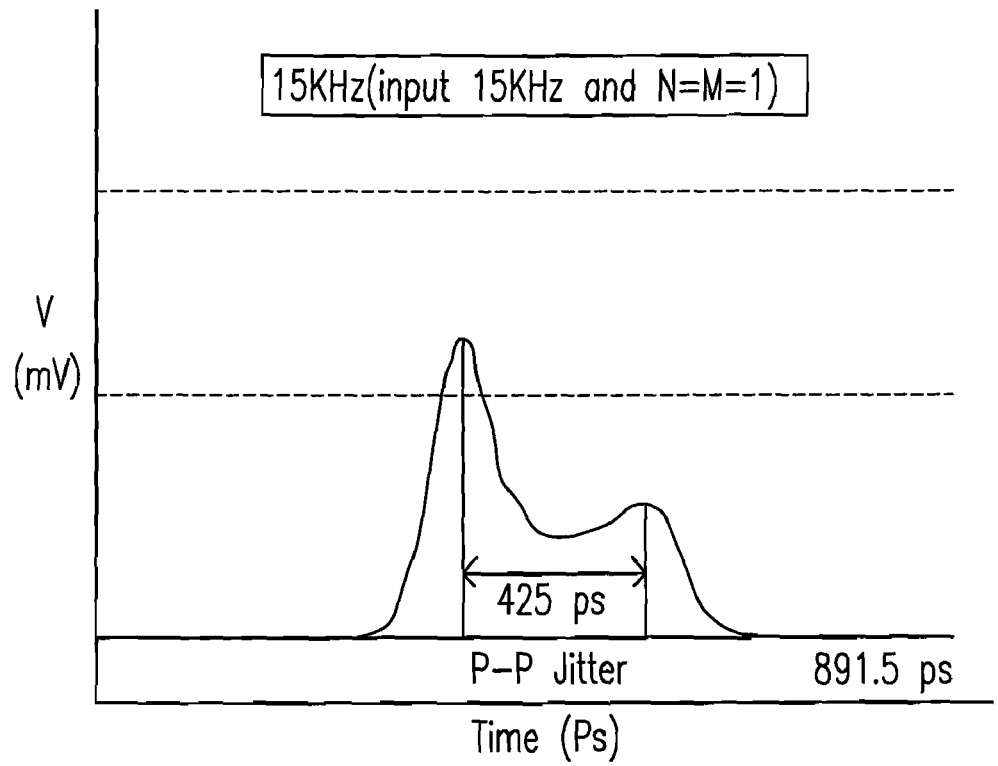

FIG. 10(b) shows the waveform of an output signal from the second frequency divider, when a frequency of the second reference clock signal is 15 KHz, N=1, and M=1. It was observed that the frequency of the output signal was 15 KHz, peak-to-peak jitter was 819.5 picosecond, and a frequency resolution was 425 picosecond, about 13 ppm of an input period.

Figure 11:
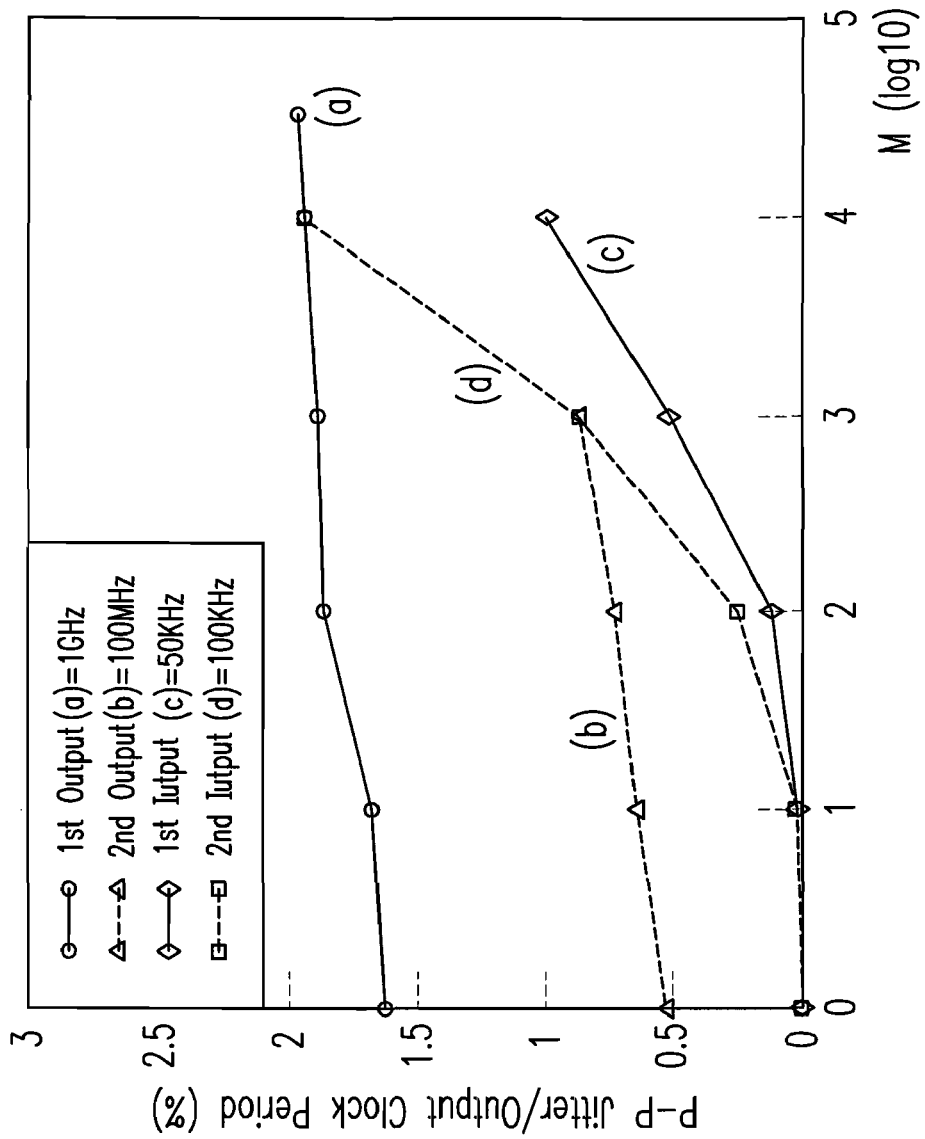
FIG. 11 shows the percentage of the jitter peak value divided by the period of the relevant output clock.

According to FIG. 11, line (a) and line (b) show the measurement results of constant output frequencies while varying input frequencies and the M; line (c) and line (d) show the measurement results of constant input frequencies while varying output frequencies and the M. It is observed that the larger the M is, the larger the peak-to-peak jitter is.

Table 3 shows a comparison in terms of performances among the present invention and the prior arts. It is observed that the present invention has a largest range of input frequencies, a largest range of output frequencies, a largest range of the value of the M, a best output frequency resolution, and a smallest circuit area.

TABLE 3

|  | Art [1] | Art [2] | Art [3] | Art [4] | Art [4] | Art [6] | Present Case |
|---|---|---|---|---|---|---|---|
| VLSI Process | 0.13 um | 90 nm | 0.65 um | 0.35 um | 0.18 um | 65 nm SOI | 0.18 um |
| Operation Voltage | 1.5 V | 0.7~2.4 V | 5 V | 3.3 V | 1.8 V | 0.5~2.3 V | 1.8 V |
| Approach | 12-b DAC analog filter | PFD + TDC digital loop | TDC digital loop | PFD digital loop | Cascaded DFC loops | PDI digital filter | TDC + novel PFD |
| Input Freq. (MHz) | X | 0.03~6 | 11.2~339.7 | 0.5~60 | 0.193~60 | X | 0.015~1390 |
| Output Freq. (MHz) | 30~650 | 0.18~600 | 0.045~61.3 | 40~51 | 2.4~378 | 500~8000 | 0.015~1390 |
| M | 1~4096 | 1~1023 | 4~1022 | 2~255 | 4~13888 | 4~64 | 1~32768 |
| DCO Resolution | X | X | 264 | X | 0.65 | X | 0.013 |
| Locking Cycle | X | >150 | <7 | <46 | <75 | X | <39 |
| P-P Jitter@MHz | 72.6@24 N = 4096 | 400@30 N = 1023 | 1590@30 N = 1022 | 70@450 N = 137 | 196@143 N = 13888 | 0.7@4000 N = 32(RMS) | 18.6@1390 N = 32768 |
| Circuit Area ($mm^2$) | 0.182 | 0.18 | 1.17 | 0.71 | 0.16 | 0.03 | 0.0258 |

TABLE 3-continued

|  | Art [1] | Art [2] | Art [3] | Art [4] | Art [4] | Art [6] | Present Case |
|---|---|---|---|---|---|---|---|
| Power Consump. (mW@MHz) | 7@240 | 1.7@520 | X | 100@500 | 15@378 | 8@1000 | 16.2@1390 |

Art [1] J. G. Maneatis, et al., "Self-Biased High-Bandwidth Low-Jitter 1-to-4096 Multiplier Clock Generator PLL", IEEE J. Solid-State Circuits, Vol. 38, No. 11, pp. 1795-1803, November 2003
Art [2] J. Lin, et al., "A PVT tolerant 0.18 MHz to 600 MHz Self-Calibrated Digital PLL in 90 nm CMOS Process", ISSCC Dig. Tec. Papers, pp. 488-489, February 2004
Art [3] T. Watanabe and S. Yamauchi, "An All-Digital PLL for Frequency Multiplication by 4 to 1022 with Seven-Cycle Lock Time", IEEE J. Solid-State Circuits, Vol. 38, No. 2, pp. 198~204, February 2003
Art [4] C. C. Chung and C. Y. Lee, "An All Digital Phase Locked Loop for High-Speed Clock Generation", IEEE J. Solid-State Circuits, Vol. 38, No. 2, pp. 347~351, February 2003
Art [5] P. L. Chen, C. C. Chung, J. N. Yang, and C. Y. Lee, "A Clock Generator with Cascaded Dynamic Frequency Counting Loops for Wide Multiplication Range Applications", IEEE J. Solid-State Circuits, Vol. 41, No. 6, pp. 1275~1285, June 2006
Art [6] J. A. Tierno, A. V. Rylyakov, et al., "A Wide Power Supply Range, Wide Tuning Range, All Static CMOS All Digital PLL in 65 nm SOI", IEEE J. Solid-State Circuits, Vol. 43, No. 1, pp. 42~51, January 2008

CONCLUSION

The present invention provides an all-digital phase lock loop structure and design for a wide range of phase locking, with the aid of concept of searching on phase shift and an all digital phase lock loop calculation scheme. The present invention takes advantage of a method of sampling and coding, to determine the output frequency through four operation modes (the counting, the rough tuning, the fine tuning, and the locked mode), and a method of binary searching as well as calculation to work out a oscillation frequency of the DCO by the control unit. Compared to the prior arts, the present invention has higher searching efficiency, shorter locking time, smaller peak-to-peak jitter, and is functional on very high frequencies. The circuit design allows the ADPLL operation with a range of 15 KHz~1.39 GHz. And the locking time is less than 39 times of the period of the second reference clock signal (see FIG. 5).

Figure 12:
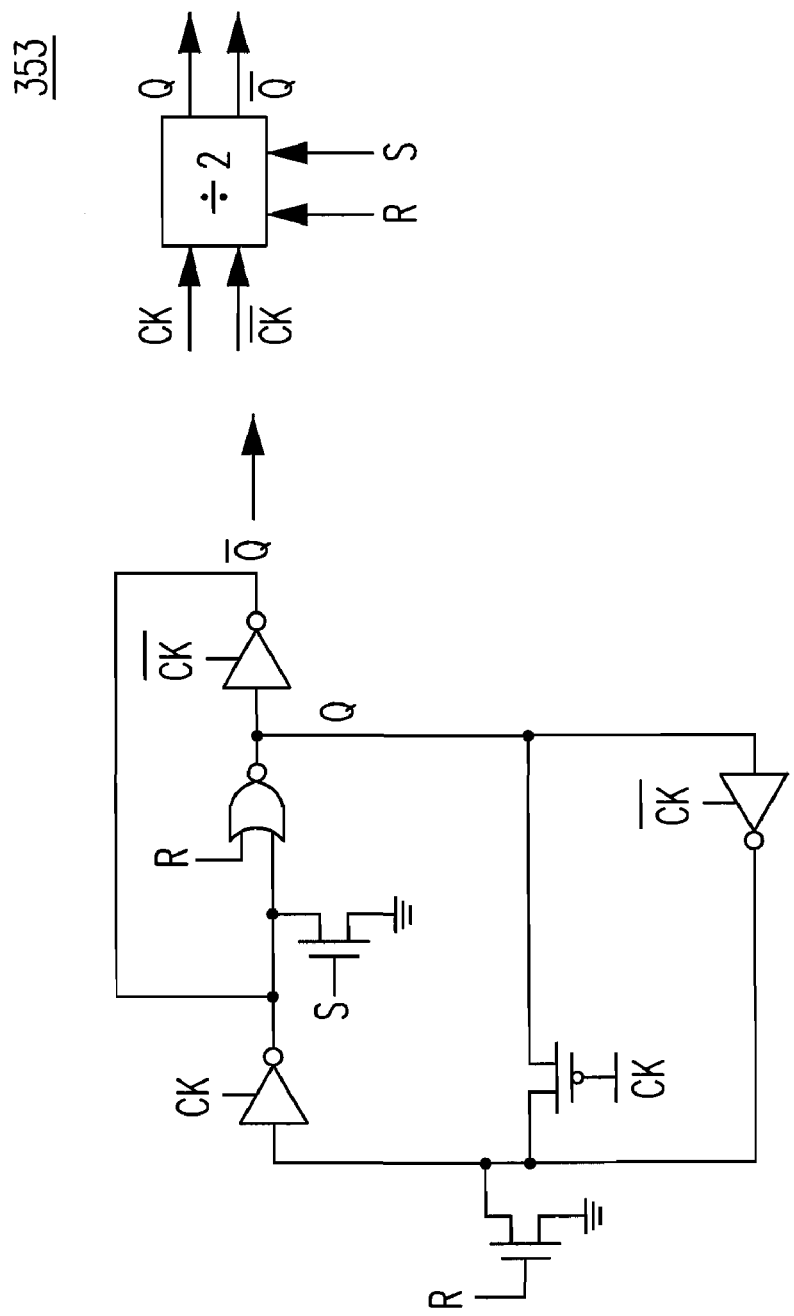
FIG. 12 is a schematic diagram showing a structure of a divided-by-two circuit.

Besides, both the first and the second frequency dividers in the ADPLL are programmable dividers with a large range of operation frequencies and capable of the field of wireless communication. And the frequency dividers comprise a decoder, a plurality of divide-by-two circuits for set/reset signals, and a plurality of logic circuits. According to FIG. 12, an embodiment for the divide-by-two circuit 353 in the second and the third frequency dividers comprises a NOR gate, 3 MOS transistors, and 3 tri-state inverters. The truth table of the divided-by-two circuit 353 is shown in Table 4. Compared to the circuit design in the prior arts, the circuit 353 has a fewer number of MOS transistors, lower power consuming, a higher operation frequency, a latch function, and can prevent capacitor leakage. It is good for set and reset signals of binary input and "0" or "1" output, which is applicable for programming with a wide range of operation frequencies.

TABLE 4

| S | R | Q | $\bar{Q}$ |
|---|---|---|---|
| 0 | 0 | Divided by 2 | |
| 0 | 1 | 0 | 1 |
| 1 | 0 | 1 | 0 |
| 1 | 1 | 0 | 0 |

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An All Digital Phase Locked Loop (r46ADPLL), comprising:
    a first frequency divider dividing a first frequency of a first feedback signal (CKOUT) by a natural number M to generate a first output signal;
    a phase-frequency detector (PFD) generating a decrement signal and an increment signal based on a phase difference and a frequency difference between a first reference clock (CKIN) signal and the first output signal;
    a control unit receiving the decrement signal, the increment signal, the natural number M and a second reference clock signal to generate a plurality of digital control signals, wherein the frequencies of the first and the second reference clock signals are identical;
    a digital controlled oscillator (DCO) generating a clock signal (CKDCO) having a second frequency based upon the digital control signals; and
    a second frequency divider receiving the digital control signals and the clock signal (CKDCO), and dividing the second frequency of the clock signal by a bit number of the digital control signals to generate the first feedback signal (CKOUT) to the first frequency divider.

2. An ADPLL as claimed in claim 1, wherein the ADPLL is integrated into a local oscillator of an FM broadcast receiver, and the first feedback signal controls an oscillation frequency of the local oscillator.

3. An ADPLL as claimed in claim 1, wherein the digital control signals comprise a first control signal, a second control signal, a third control signal, a natural number N1 and a natural number N2, and the natural numbers N1 and N2 serve as divisors for the first and the second frequency dividers, respectively.

4. An ADPLL as claimed in claim 3, wherein:
    the second control signal is triggered by a first positive edge of a first period of the second reference clock signal;
    the first control signal is triggered by a second positive edge of a second period of the second reference clock signal; and
    the third control signal is triggered by a respective positive edge of all periods of the second reference clock signal except the first period after the first period is over, and the third control signal includes a first, a second and a third group of binary codes for controlling the DCO.

5. An ADPLL as claimed in claim 4, wherein the DCO comprises a plurality of tri-state inverters and a plurality of NAND gates forming at least a ring oscillator, and at least four of the plurality of tri-state inverters are connected in parallel and further connected to the ring oscillator.

6. An ADPLL as claimed in claim 5, further comprising:
a first decoder receiving and decoding the first group of binary codes for inputting a first decoding result to the NAND gates;
a second decoder receiving and decoding the second group of binary codes for inputting a second decoding result to the tri-state inverters; and a first multiplexer receiving a first value group of the natural number M and a value of 32768, and a second value group of the natural number M and a value of $2^K$ for respectively determining the natural numbers N1 and N2 based upon a signal level of the first control signal, wherein K is an integral within a range from 0 to 15.

7. An ADPLL as claimed in claim 3, further comprising:
a third frequency divider dividing a third frequency of another clock signal by a natural number N to generate a second output signal; and
a time-delay unit coupled to the third frequency divider, for delaying the second output signal from the third frequency divider based upon a timing difference of a level change of the second control signal, wherein the delayed second output signal serves as the first reference clock signal, wherein any one of the bit number of the digital control signals, the natural number N and the natural number M are within a range of 1 to 32768.

8. An ADPLL as claimed in claim 7, wherein the PFD comprises a first, a second, a third and a fourth buffers and a first, a second, a third and a fourth D type flip-flop (DFF) devices, wherein:
the first and the third buffers delay the first reference clock signal and transmit the delayed first reference clock signal into the first and the third DFF devices respectively, and the second and the fourth buffers delay the first output signal and transmit the delayed first output signal into the first and second and the third and fourth DFF devices respectively;
the first DFF device samples the delayed first reference clock signal received from the first buffer based upon a positive edge of each cycle of the delayed first output signal received from the second buffer for sending a first sampling result (q1) to the second DFF device, the second DFF device generates a second sampling result (q1d) by delaying the q1 by one cycle time, the third DFF device samples the delayed first reference clock signal received from the third buffer based upon the positive edge of each cycle of the delayed first output signal received from the fourth buffer for sending a third sampling result (q2) to the fourth DFF device, and the fourth DFF device generates a fourth sampling result (q2d) by delaying q2 by one cycle time;
and a finite state machine (FSM) generating the decrement signal and the increment signal based upon each of the q1, q1d, q2 and q2d from the four DFF devices;
wherein the FSM generates the decrement signal at one of instances if both the q1 and the q2 are 1, and if the q1 changes from 0 to 1; and
the FSM generates the increment signal at one of instances if both the first sampling result q1 and the q2 are 0, and if the q2 changes from 1 to 0.

9. An ADPLL as claimed in claim 3, wherein:
the second frequency divider comprises a decoder and a plurality of dividing-by-two circuits, wherein the decoder of the second frequency divider receives and decodes the natural number N2 for inputting a decoding result to the dividing-by-two circuits; and the dividing-by-two circuits receive the second frequency of the clock signal and the decoding result, and then output a frequency-divided signal of the first feedback signal lasting for a period of N2 cycles of the clock signal.

10. A digital controlled oscillator (DCO), comprising:
a plurality of tri-state inverters including a first, a second, a third, a fourth, a fifth, a sixth, a seventh and an eighth tri-state inverters;
a plurality of NAND gates forming at least a ring oscillator; and a plurality of MOS transistors including a first, a second, a third, a fourth, a fifth, a sixth, a seventh and an eighth MOS transistors, each of which has a drain and a gate, wherein:
the first, the second, the third and the fourth tri-state inverters are connected in parallel and are further connected to the ring oscillator;
the drains of the first, the second, the third, the fourth, the fifth, the sixth, the seventh and the eighth MOS transistors are commonly connected;
the gates of the first and the second MOS transistors are electrically coupled to an input and an output of the fifth tri-state inverter respectively;
the gates of the third and the fourth MOS transistors are electrically coupled to an input and an output of the sixth tri-state inverter respectively;
the gates of the fifth and the sixth MOS transistors are electrically coupled to an input and an output of the seventh tri-state inverter respectively;
the gates of the seventh and the eight MOS transistors are electrically coupled to an input and an output of the eighth tri-state inverter respectively; and
a size difference between any two of the first, the second, the third, the fourth, the fifth, the sixth, the seventh and the eighth MOS transistors is used to adjust a parasitic capacitance therein for improving a frequency resolution of a clock signal output from the DCO.

11. A DCO as claimed in claim 10, wherein relative decoding results stored in the NAND gates and in the tri-state inverters and a group of binary codes are input to the MOS transistors of the DCO to control a switch condition and to adjust an oscillation frequency of the DCO.

12. A DCO as claimed in claim 11, wherein:
there exist $2^2$ types of decoded conditions stored in the NAND gates, $2^3$ types of decoded conditions stored in the tri-state inverters, and $2^{13}$ types of switch conditions for the MOS transistors;
the DCO has oscillation frequencies of $2^{18}$ variations;
an oscillation level of the DCO is 5, if a decoded bit stored in the NAND gates is 00;
the oscillation level of the DCO is 7, if the decoded bit stored in the NAND gates is 01;
the oscillation level of the DCO is 9, if the decoded bit stored in the NAND gates is 10; and
the oscillation level of the DCO is 11, if the decoded bit stored in the NAND gates is 11.

13. A phase lock circuit, comprising:
a phase-frequency detector (PFD) generating a decrement signal and an increment signal based on a first reference clock signal and a first output signal;
a control unit coupled to the PFD, and receiving the decrement signal, the increment signal, and a second reference clock signal to generate a plurality of digital control signals; and a digital controlled oscillator (DCO) coupled to the control unit, and generating a clock signal based upon the digital control signals;

a first frequency divider coupled to the control unit, and dividing a first frequency of a first feedback signal to generate the first output signal; and a second frequency divider coupled to the DCO, the control unit and the first frequency divider, and receiving the digital control signals and the clock signal for generating the first feedback signal to the first frequency divider, wherein the clock signal has a second frequency, and the second frequency divider divides the second frequency by a bit number of the digital control signals to generate the first feedback signal.

14. A phase lock circuit as claimed in claim 13, wherein:
the decrement signal and the increment signal are generated based on a phase difference and a frequency difference between the first reference clock signal and the first output signal; and the frequencies of the first and the second reference clock signals are identical.

15. A phase lock circuit as claimed in claim 13, wherein the digital control signals comprise a first, a second, and a third control signals, the second control signal is triggered by a first positive edge of a first period of the second reference clock signal, the first control signal is triggered by a second positive edge of a second period of the second reference clock signal, the third control signal is triggered by a respective positive edge of all periods of the second reference clock signal except the first period after the first period is over, and the digital control signals include a plurality of binary codes for controlling the DCO.

* * * * *